United States Patent
Wang et al.

(10) Patent No.: US 11,600,758 B2
(45) Date of Patent: Mar. 7, 2023

(54) ASYMMETRICAL PN JUNCTION THERMOELECTRIC COUPLE STRUCTURE AND ITS PARAMETER DETERMINATION METHOD

(71) Applicant: JIANGSU UNIVERSITY, Zhenjiang (CN)

(72) Inventors: Ruochen Wang, Zhenjiang (CN); Ding Luo, Zhenjiang (CN); Wei Yu, Zhenjiang (CN); Weiqi Zhou, Zhenjiang (CN); Long Chen, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 314 days.

(21) Appl. No.: 16/959,035

(22) PCT Filed: Mar. 19, 2019

(86) PCT No.: PCT/CN2019/078587
§ 371 (c)(1),
(2) Date: Jun. 29, 2020

(87) PCT Pub. No.: WO2020/181568
PCT Pub. Date: Sep. 17, 2020

(65) Prior Publication Data
US 2021/0217944 A1    Jul. 15, 2021

(30) Foreign Application Priority Data
Mar. 11, 2019  (CN) .......................... 201910179839.9

(51) Int. Cl.
*H01L 35/32* (2006.01)
*G01R 21/06* (2006.01)
(Continued)

(52) U.S. Cl.
CPC .............. *H01L 35/32* (2013.01); *G01R 21/06* (2013.01); *H10N 10/82* (2023.02); *G01R 31/2632* (2013.01)

(58) Field of Classification Search
CPC ..... G01R 21/06; G01R 31/2632; H01L 35/10; H01L 35/32
See application file for complete search history.

(56) References Cited

U.S. PATENT DOCUMENTS

2007/0240751 A1 * 10/2007 Takahashi ............... H01L 35/34
228/176
2011/0100406 A1   5/2011 Danenberg
(Continued)

FOREIGN PATENT DOCUMENTS

| CN | 102106010 A | 6/2011 |
| CN | 103973171 A | 8/2014 |
| CN | 105742476 A | 7/2016 |

*Primary Examiner* — Terrell S Johnson
(74) *Attorney, Agent, or Firm* — Heslin Rothenberg Farley & Mesiti, P.C.

(57) ABSTRACT

The present invention discloses an asymmetrical PN junction thermoelectric couple structure and its parameter determination method. By changing the structural parameters of p-type semiconductor or n-type semiconductor, the current generated by p-type semiconductor is equal to the current generated by the n-type semiconductor, so that the high-efficiency output of PN junction thermoelectric couple can be realized. Meanwhile, the present invention provides a method for determining the parameters of PN junction based on the numerical solution method. Finally, the optimal size parameters of PN junction are obtained.

15 Claims, 4 Drawing Sheets

(51) Int. Cl.
*H01L 35/10* (2006.01)
*G01R 31/26* (2020.01)

(56) References Cited

U.S. PATENT DOCUMENTS

2012/0085382 A1* 4/2012 Sahin ................ H01L 35/34
    136/205
2013/0284228 A1* 10/2013 Toyoda ............... H01L 35/04
    438/54

* cited by examiner

ASYMMETRICAL PN JUNCTION THERMOELECTRIC COUPLE STRUCTURE AND ITS PARAMETER DETERMINATION METHOD

CROSS REFERENCE TO RELATED APPLICATIONS

This application is a U.S. National Phase filing under 35 U.S.C. § 371 of International Application PCT/CN2019/078587, filed Mar. 19, 2019. PCT/CN2019/078587 claims priority from Chinese Patent Application Number 201910179839.9, filed Mar. 11, 2019. The entire contents of each of these applications are hereby expressly incorporated herein by reference.

TECHNICAL FIELD

This invention belongs to the field of thermoelectric conversion and heat recovery, in particular relates to an asymmetric PN junction thermoelectric couple structure and its parameter determination method. Compared with traditional symmetric PN junction thermoelectric couple structure, the present invention can improve the output performance of the PN junction thermoelectric couple and improve its thermoelectric conversion efficiency.

BACKGROUND ART

In recent years, the energy problem is becoming more and more serious. Various countries have issued relevant policies, such as increasing oil prices, promoting new energy vehicles, etc., to control the exploitation and utilization of non-renewable energy (e.g. oil, coal and natural gas). On the other hand, energy technologies such as nuclear power, hydropower, wind power, photovoltaic power and thermoelectricity don't need to consume fossil fuels, and attract great attention at home and abroad. Among them, photovoltaic and thermoelectricity are clean energy technologies that generate electricity by utilizing directional movement of carriers of semiconductors which are generated under the reaction of solar radiation and temperature difference, and have the advantages of permanence, cleanness and no moving parts, etc. At present, the photovoltaic technology develops rapidly, and has achieved a great number of mature applications. However, thermoelectric technology is still in the development stage of commercialization due to its high material cost and low conversion efficiency.

Thanks to the development of modern technology, the performance of thermoelectric materials has been greatly improved. Thermoelectric technology starts to be widely used in the field of heat recovery, such as automobile exhaust waste heat recovery, industrial waste heat recovery, etc. In addition, due to the low output voltage of a single PN junction thermoelectric couple, a number of PN junctions are generally connected in series to form a thermoelectric power generation module, so that the output voltage can reach an energy level that can be recycled. However, thermoelectric power generation module is only a combination of many PN junctions in series. In the research, it is often simplified. A single PN junction is taken as the research object for structure optimization (such as hexagonal semiconductor structure, segmented semiconductor structure and pyramid semiconductor structure), so as to achieve higher output power and thermoelectric conversion efficiency. However, these structural optimization methods ignore the essence that PN junction is formed by p-type semiconductor and n-type semiconductor in series. Both p-type semiconductor and n-type semiconductor use the same structural size and the same number of thermoelectric materials. In practical applications, in order to make p-type semiconductors rich in holes and n-type semiconductors rich in electrons, the thermoelectric materials and doping concentration used by P-electrode and N-electrode are different, causing the differences in parameters of thermoelectric materials of P-electrode and N-electrode. When the PN junction works in the same temperature difference, the current density generated by P-electrode is different from the current density generated by N-electrode, so that the overall output current of the PN junction is limited by the smaller current density.

CONTENTS OF THE INVENTION

The present invention serves the purpose of providing an asymmetric PN junction thermoelectric couple structure and its parameter determination method, in order to overcome the overall output current limitation problem of PN junction due to the inconsistent material parameters of p-type semiconductor and n-type semiconductor, to improve the overall output and thermoelectric conversion efficiency of PN junction thermoelectric couple, and to achieve higher output performance under the same usage amount of thermoelectric material.

The purpose of the present invention is realized by the following technical schemes:

An asymmetric PN junction thermoelectric couple structure includes ceramic plates in opposite arrangement, copper electrodes, p-type semiconductor and n-type semiconductor with the same height, where the top and bottom ends of the p-type semiconductor and n-type semiconductor are connected in series by copper electrodes, and are sandwiched between the top and bottom ceramic plates, wherein the sum of length of the p-type semiconductor $L_p$ and the length of n-type semiconductor $L_n$ is 2L, and L is the initial length of p-type semiconductor and n-type semiconductor; The length of the p-type semiconductor $L_p$ is $L \pm i \times \Delta l$, and the length of the n-type semiconductor $L_n$ is $L \mp i \times \Delta l$, where i is the number of iterations to be determined, and $\Delta l$ is the length change value in each iteration calculation of the p-type semiconductor and the n-type semiconductor; the total length of copper electrode in contact with the top ends of p-type semiconductor and n-type semiconductor is $2L+L_s$, where $L_s$ is the distance between p-type semiconductor and n-type semiconductor; the length of the copper electrode in contact with the bottom end of the p-type semiconductor is $L_p+L_s/2$, and the length of the copper electrode in contact with the bottom end of the n-type semiconductor is $L_n+L_s/2$.

A method for determining the parameters of asymmetric PN junction thermoelectric couple structure includes: calculating the integral mean values of electrical resistivity of p-type semiconductor ($\overline{\rho_p}$) and n-type semiconductor ($\overline{\rho_n}$); determining the length relationship between p-type semiconductor and n-type semiconductor; establishing differential equations of PN junction thermoelectric couple structure; setting boundary conditions to calculate the Peltier heat of p-type semiconductor and n-type semiconductor; setting current boundary conditions to connect load resistance with the copper electrodes; setting temperature boundary conditions to load the temperature, and finally calculating the output voltage at both ends of the load resistance to get the output power of the PN junction thermoelectric couple.

Further, if $\overline{\rho_p} > \overline{\rho_n}$, setting the length of p-type semiconductor $L_p$ as $L+i \times \Delta l$ and setting the length of n-type semiconductor $L_n$ as $L-i \times \Delta l$; if $\overline{\rho_p} < \overline{\rho_n}$, setting the length of p-type semiconductor $L_p$ as $L-i\times\Delta l$ and setting the length of n-type semiconductor $L_n$ as $L+i\times\Delta l$; and if $\overline{\rho_p}=\overline{\rho_n}$, setting the lengths of p-type semiconductor and n-type semiconductor as $L_p=L_n=L$.

Further, the specific processes for determining the length of p-type semiconductor and n-type semiconductor when $\overline{\rho_p}>\overline{\rho_n}$ and $\overline{\rho_p}<\overline{\rho_n}$ include: under a selected value of $\Delta l$ ($\Delta l<L/10$), calculating the overall output powers $P_0$ and $P_1$ of the PN junction thermoelectric couple when i=0 and 1; judging whether $P_0<P_1$, if so, i=i+1, then returning to recalculate the overall output power $P_i$ of PN junction thermoelectric couple, and judging whether $P_i<P_{i+1}$ again, ending the loop when $P_i \geq P_{i+1}$.

Further, the boundary conditions for calculating Peltier heat are as follows:

On the contact surfaces of the p-type semiconductor and n-type semiconductor with the bottom copper electrodes, the temperature of bottom copper electrodes equals the temperature of p-type semiconductor and n-type semiconductor, that is $T_{co}|_{z=H_1+H_2}=T_{P,N}|_{z=H_1+H_2}$; the heat conduction of the bottom copper electrodes equals the heat conduction of p-type semiconductor and n-type semiconductor plus the Peltier heat of the p-type semiconductor and n-type semiconductor, that is, $$-\lambda_{co}\frac{\partial T_{co}}{\partial Z}\bigg|_{z=H_1+H_2} = -\lambda_{P,N}\frac{\partial T_{P,N}}{\partial Z}\bigg|_{z=H_1+H_2} + \alpha_{P,N}T\overline{J_z}|_{z=H_1+H_2},$$

where $z=H_1+H_2$ represents the coordinate axis positions of the contact surfaces;

On the contact surfaces of the p-type semiconductor and n-type semiconductor with the top copper electrodes, the temperature of top copper electrodes equals the temperature of p-type semiconductor and n-type semiconductor, that is $T_{co}|_{z=H_1+H_2+H_3}=T_{P,N}|_{z=H_1+H_2+H_3}$; the heat conduction of the top copper electrodes equals the heat conduction of p-type semiconductor and n-type semiconductor plus the Peltier heat of the p-type semiconductor and n-type semiconductor, that is, $$-\lambda_{P,N}\frac{\partial T_{P,N}}{\partial Z}\bigg|_{z=H_1+H_2+H_3} + \alpha_{P,N}T\overline{J_z}|_{z=H_1+H_2+H_3} = -\lambda_{co}\frac{\partial T_{co}}{\partial Z}\bigg|_{z=H_1+H_2+H_3},$$

where $z=H_1+H_2+H_3$ represents the coordinate axis positions of the contact surfaces.

Further, the current boundary conditions are: on the left end surface of the bottom copper electrode and the left end surface of the resistance, both surfaces are set to be grounded, that is, the voltage is zero; on the right end surface of the bottom copper electrode and the right end surface of the resistance, both surfaces are set to be connected electrically, that is, the voltages are equal.

Furthermore, the temperature boundary conditions are: the contact surfaces of the PN junction thermoelectric couple with the environment are set as adiabatic boundary; the bottom surface of the bottom ceramic plate is set as high temperature boundary, and the top surface of the top ceramic plate is set as low temperature boundary.

The beneficial effects of the present invention are as follows:

The present invention provides an asymmetrical PN junction thermoelectric couple structure and its parameter optimization method. The p-type semiconductor and n-type semiconductor of the asymmetric PN junction thermoelectric couple structure have different cross-sectional areas, wherein the length of the p-type semiconductor is $L\pm i\times\Delta l$, and the length of the n-type semiconductor is $L\mp i\times\Delta l$; by solving the differential equations of PN junction thermoelectric couple, the overall output power of PN junction is obtained; the appropriate $\Delta l$ value is selected, the iterative solution is carried out for i times, and the maximum output power of PN junction thermoelectric couple is finally obtained, so as to determine the length size of p-type semiconductor and n-type semiconductor; the present invention can improve the output power of PN junction thermoelectric couple, guide the optimization of traditional PN junction thermoelectric couple structure, save thermoelectric materials, and reduce the material cost of thermoelectric power generation module to a certain extent.

EMBODIMENT

The technical schemes of the present invention are described below in combination with the drawings, the specific structure of PN junction thermoelectric couple and its material parameters.

Figure 1:
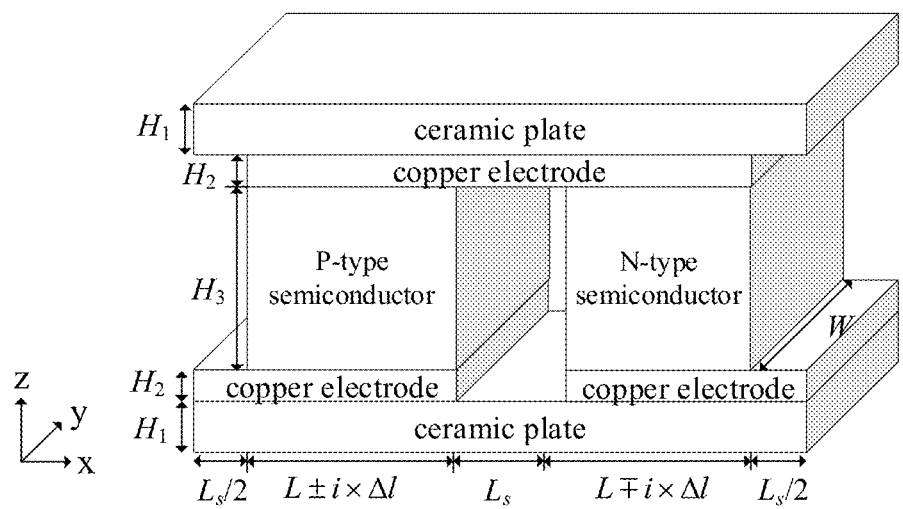
FIG. 1 shows schematic diagram of the asymmetric PN junction thermoelectric couple structure.

As shown in FIG. 1, an asymmetric PN junction thermoelectric couple structure includes ceramic plates, copper electrodes, p-type semiconductor, and n-type semiconductor; the p-type semiconductor and the n-type semiconductor are connected in series by copper electrodes and sandwiched between two ceramic plates; the heights of ceramic plates, copper electrodes, and p-type semiconductor are $H_1$, $H_2$ and $H_3$, respectively, and the height of n-type semiconductor is equal to the height of p-type semiconductor; said ceramic plates, copper electrodes, p-type semiconductor, and n-type semiconductor possess the same width of w; the length of the ceramic plates is $2L+2L_s$, where $L_s$ is the distance between the p-type semiconductor and the n-type semiconductor; the length of top copper electrode is $2L+L_s$, the length of the p-type semiconductor $L_p$ equals $L+i\times\Delta l$, the length of the n-type semiconductor $L_n$ equals $L\mp i\times\Delta l$, and the lengths of the two copper electrodes at the bottom end equal the length of the connected semiconductor plus $L_s/2$, respectively; where L is the initial length of the p-type semiconductor and the n-type semiconductor, i is the number of iterations to be determined, and $\Delta l$ is the length change value of the p-type semiconductor and the n-type semiconductor in each iteration calculation.

Figure 2:
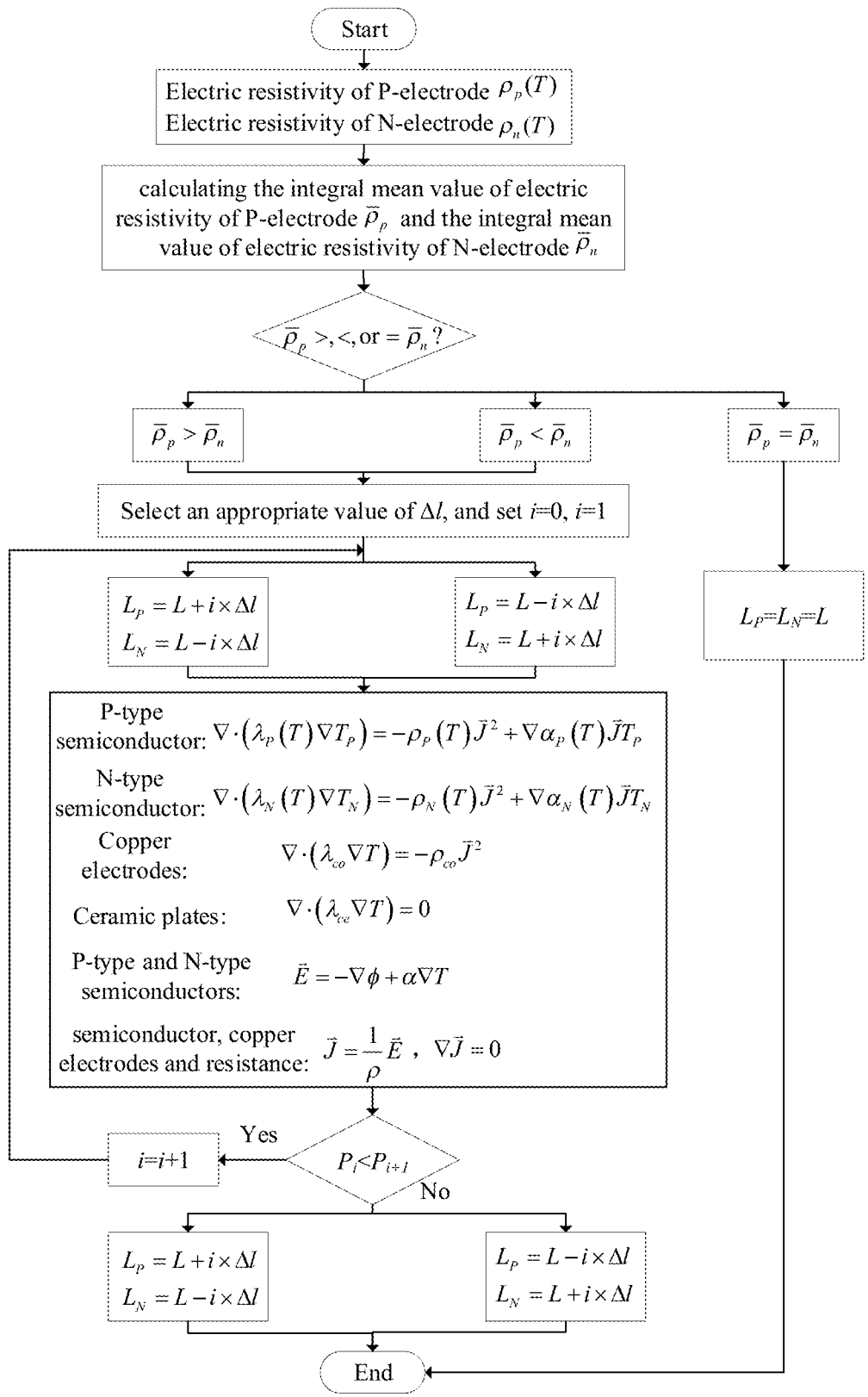
FIG. 2 shows parameter calculation flow diagram of the asymmetric PN junction thermoelectric couple structure.

As shown in FIG. 2, specific processes of the method for determining the parameters of asymmetric PN junction thermoelectric couple structure are as follows:

Step 1, calculating the integral mean value of electrical resistivity of the p-type semiconductor ($\overline{\rho_p}$) and the n-type semiconductor ($\overline{\rho_n}$) and determining the length relationship between the p-type semiconductor and the n-type semiconductor;

(1) Calculating the integral mean value of electrical resistivity of the p-type semiconductor $\overline{\rho_p}$;

$$\overline{\rho_p} = \frac{\int_{T_c}^{T_h} \overline{\rho_p}(T)dT}{T_h - T_c} \quad (1)$$

where $T_h$ and $T_c$ are the hot-end and cold-end temperature of the PN junction thermoelectric couple respectively, and $\rho_p(T)$ is the electrical resistivity of the p-type semiconductor;

(2) Calculating the integral mean value of electrical resistivity of the n-type semiconductor $\overline{\rho_n}$;

$$\overline{\rho_n} = \frac{\int_{T_c}^{T_h} \overline{\rho_p}(T)dT}{T_h - T_c} \quad (2)$$

where $\rho_n(T)$ is the electrical resistivity of the n-type semiconductor;

(3) If $\overline{\rho_p} > \overline{\rho_n}$, the length of the p-type semiconductor $L_p$ is set as L+i×Δl, and the length of the n-type semiconductor $L_n$ is set as L−i×Δl; if $\overline{\rho_p} < \overline{\rho_n}$, the length of the p-type semiconductor $L_p$ is set as L−i×Δl, and the length of the n-type semiconductor $L_n$ is set as L+i×Δl; if $\overline{\rho_p} = \overline{\rho_n}$, the length of p-type semiconductor is set to be equal to the length of the n-type semiconductor, i.e., $L_p = L_p = L$.

Figure 3:
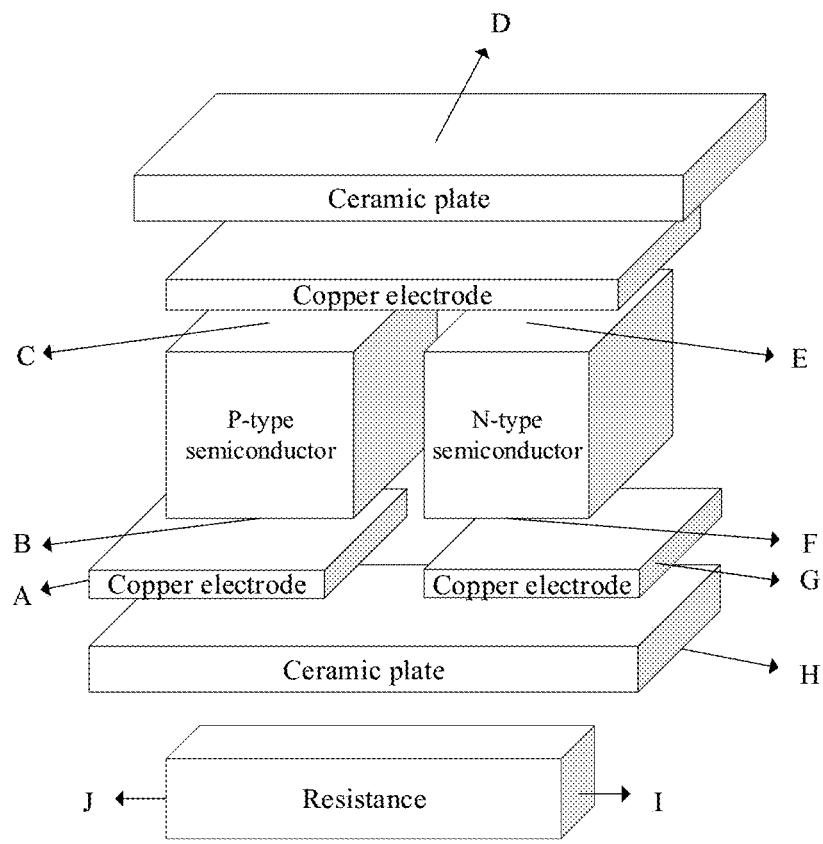
FIG. 3 shows diagram for defining the surface boundary conditions.

Step 2, establishing the differential equations of the PN junction thermoelectric couple;

(1) The energy conservation equation of the p-type semiconductor is:

$$\nabla \cdot (\lambda_p(T)\nabla T_p) = -\rho_p(T)\overline{J}^2 + \nabla \alpha_p(T)\overline{J}T_p \quad (3)$$

where $\overline{J}$ is the current density vector, T is the temperature, and $T_p$ is the temperature of the p-type semiconductor;

(2) The energy conservation equation of the n-type semiconductor is:

$$\nabla \cdot (\lambda_n(T)\nabla T_n) = -\rho_n(T)\overline{J}^2 + \nabla \alpha_n(T)\overline{J}T_n \quad (4)$$

where $T_n$ is the temperature of the n-type semiconductor;

(3) The energy conservation equation of the copper electrodes is:

$$\nabla \cdot (\lambda_{co}\nabla T) = -\rho_{co}\overline{J}^2 \quad (5)$$

where $\lambda_0$ and $\rho_{co}$ are the thermal conductivity and electrical resistivity of the copper electrodes respectively;

(4) The energy conservation equation of the ceramic plates is:

$$\nabla \cdot (\lambda_{ce}\nabla T) = 0 \quad (6)$$

where $\lambda_{ce}$ is the thermal conductivity of the ceramic plates;

(5) In addition, the electrical field density vector of the p-type semiconductor and the n-type semiconductor is:

$$\overline{E} = -\nabla \phi + \alpha \nabla T \quad (7)$$

where $\overline{E}$ is the electrical field density vector, $\phi$ is the electric potential difference, and $\alpha$ is the Seebeck coefficient;

(6) p-type semiconductor, n-type semiconductor, copper electrodes, and resistance follow the current conservation equations, which are:

$$\overline{J} = \frac{1}{\rho}\overline{E} \quad (8)$$

$$\Delta \overline{J} = 0 \quad (9)$$

where $\rho$ is the material electrical resistivity;

Step 3, as shown in FIG. 3, setting the boundary conditions for the surfaces A, B, C, D, E, F, G, H, I, J of the PN junction thermoelectric couple, where surfaces A, G, I, J are the voltage boundary and connect the thermoelectric couple with the load resistance in series; surfaces B, C, E, F are the Peltier heat boundary, the Peltier heat on the contact surfaces between the p-type semiconductor, the n-type semiconductor and the copper electrodes is calculated, and surfaces D, H are the temperature boundary, on two ends of which the temperature load is imposed;

(1) On the contact surface B between the p-type semiconductor and the bottom copper electrode and the contact surface F between the n-type semiconductor and the bottom copper electrode, the following equations are satisfied:
The temperature of the bottom copper electrodes equals the temperature of the p-type semiconductor and the n-type semiconductor, that is:

$$T_{co}|_{z=H_1+H_2} = T_{P,N}|_{z=H_1+H_2} \quad (10)$$

The heat conduction of the bottom copper electrodes equals the heat conduction of the p-type semiconductor and n-type semiconductor plus the Peltier heat of the p-type semiconductor and n-type semiconductor, that is:

$$-\lambda_{co}\frac{\partial T_{co}}{\partial Z}\bigg|_{z=H_1+H_2} = -\lambda_{P,N}\frac{\partial T_{P,N}}{\partial Z}\bigg|_{z=H_1+H_2} + \alpha_{P,N}T\overline{J_z}|_{z=H_1+H_2} \quad (11)$$

where $z=H_1+H_2$ represents the coordinate axis positions of the contact surfaces B and F;

(2) On the contact surface C between the p-type semiconductor and the top copper electrode and the contact surface E between the n-type semiconductor and the top copper electrode, the following equations are satisfied:
The temperature of the top copper electrodes equals the temperature of the p-type semiconductor and n-type semiconductor, that is:

$$T_{co}|_{z=H_1+H_2H_3} = T_{P,N}|_{z=H_1+H_2H_3} \quad (12)$$

The heat conduction of the top copper electrodes equals the heat conduction of the p-type semiconductor and n-type semiconductor plus the Peltier heat of the p-type semiconductor and n-type semiconductor, that is:

$$-\lambda_{co}\frac{\partial T_{co}}{\partial Z}\bigg|_{z=H_1+H_2+H_3} = -\lambda_{P,N}\frac{\partial T_{P,N}}{\partial Z}\bigg|_{z=H_1+H_2+H_3} + \alpha_{P,N}T\overline{J_z}|_{z=H_1+H_2+H_3} \quad (13)$$

where $z=H_1+H_2+H_3$ represents the coordinate axis positions of the contact surfaces C and E;

(3) The current boundary conditions about the connection between the load resistance and the copper electrodes are:
On the left end surface of the bottom copper electrode A and the left end surface of the resistance J, both A and J are set to be grounded, that is, the voltage is zero; on the right end surface of the bottom copper electrode G and the right end surface of the resistance I, G and I are set to be connected electrically, that is, the voltages are equal;

(4) The temperature boundary conditions are:
The contact surfaces of the PN junction thermoelectric couple with the environment are set as adiabatic boundary; the bottom surface of the bottom ceramic plate H is set as high temperature boundary, that is, the temperature of surface H is $T_H$; and the top surface of the top ceramic plate D is set as low temperature boundary, that is, the temperature of surface D is $T_C$.

Step 4, determining an appropriate $\Delta l$ which meets the condition of $\Delta l < L/10$; according to above differential equations and the settings of boundary conditions, the output voltage on both ends of the load resistance $U_L$ can be computed with the help of finite element software ANSYS; according to equation $P = U_L^2/R_L$, calculating the overall output power of the PN junction thermoelectric couple $P_0$ and $P_1$ when i=0 and i=1; judging whether $P_0 < P_1$, if so, i=i+1, returning to recalculate the overall output power of the PN junction thermoelectric couple $P_i$, and judging whether $P_i < P_{i+1}$ again, ending the loop until $P_i \geq P_{i+1}$; obtaining that when $\overline{\rho_p} > \overline{\rho_n}$, the length of the p-type semiconductor is $L_p = L + i \times \Delta l$, and the length of the n-type semiconductor is $L_n = L - i \times \Delta l$, or when $\overline{\rho_p} < \overline{\rho_n}$, the length of the p-type semiconductor is $L_p = L - i \times \Delta l$, and the length of the n-type semiconductor is $L_n = L + i \times \Delta l$.

The used thermoelectric material of the PN junction thermoelectric couple in this example is BiSbTeSe based material, and the parameters of BiSbTeSe-based thermoelectric material of p-type semiconductor and n-type semiconductor are listed in Table 1.

TABLE 1

Parameters of BiSbTeSe-based thermoelectric material of p-type semiconductor and n-type semiconductor

| parameter | p-type semiconductor | n-type semiconductor |
| --- | --- | --- |
| Seebeck coefficient (μv/K) | $3.064 \times 10^{-7}T^4$ $-4.976 \times 10^{-4}T^3 +$ $0.287 \times T^2$ $-69.799 \times T + 6253.741$ | $1.055 \times 10^{-7}T^4$ $-1.639 \times 10^{-4}T^3 +$ $9.549 \times 10^{-2}T^2$ $-24.881T + 2303.862$ |
| Thermal conductivity (w/m · K) | $3.612 \times 10^{-10}T^4$ $-5.247 \times 10^{-7}T^3 +$ $2.636 \times 10^{-4}T^2$ $-5.156 \times 10^{-2}T + 3.420$ | $-2.469 \times 10^{-10}T^4$ $+3.907 \times 10^{-7}T^3 -$ $2.241 \times 10^{-4}T^2$ $+5.413 \times 10^{-2}T - 3.804$ |
| Electrical resistivity ($10^{-6}\Omega \cdot m$) | $4.429 \times 10^{-8}T^4$ $-9.118 \times 10^{-5}T^3 +$ $6.777 \times 10^{-2}T^2$ $-21.579T + 2526.630$ | $1.317 \times 10^{-8}T^4$ $-2.087 \times 10^{-5}T^3 +$ $1.236 \times 10^{-2}T^2$ $-3.204T + 315.218$ |

In addition, the relative size parameters of PN junction and other parameters are listed in Table 2.

TABLE 2

Size parameters of PN junction and other parameters

| Parameter | value |
| --- | --- |
| Height of ceramic plates $H_1$ (mm) | 0.8 |
| Height of cooper electrodes $H_2$ (mm) | 0.2 |
| Height of p-type and n-type semiconductors $H_3$ (mm) | 1.4 |
| Initial length of p-type and n-type semiconductors L (mm) | 1.7 |
| Spacing between p-type and n-type semiconductors $L_s$ (mm) | 0.8 |
| Width W (mm) | 1.7 |
| Length × Width × Height of load resistance (mm) | 5 * 1 * 1 |
| Thermal conductivity of ceramic plates $\lambda_{ce}$ (w/m · K) | 18 |
| Thermal conductivity of copper electrodes $\lambda_{co}$ (w/m · K) | 397 |
| Electrical resistivity of copper electrodes $\rho_{co}$ ($\Omega \cdot m$) | $1.75 \times 10^{-8}$ |
| Electrical resistivity of load resistance ($\Omega \cdot m$) | $1 \times 10^{-5}$ |
| Hot end temperature of PN junction $T_h$ (K) | 500 |
| Cold end temperature of PN junction $T_c$ (K) | 300 |

The integral mean value of electrical resistivity of the p-type semiconductor ($\overline{\rho_p}$) and the n-type semiconductor ($\overline{\rho_n}$) can be computed by equation (1) and equation (2) respectively; the calculation results are: $\overline{\rho_p} = 4.11 \times 10^{-5} \Omega \cdot m$ and $\overline{\rho_n} = 1.36 \times 10^{-5} \Omega \cdot m$; because $\overline{\rho_p} > \overline{\rho_n}$, the length of the p-type semiconductor is $L_p = L + i \times \Delta l$, and the length of the n-type semiconductor is $L_n = L - i \times \Delta l$; $\Delta l$ is selected as 0.1 mm for calculating the output parameters of the PN junction and further determining the length of the p-type semiconductor and n-type semi conductor.

Figure 4:
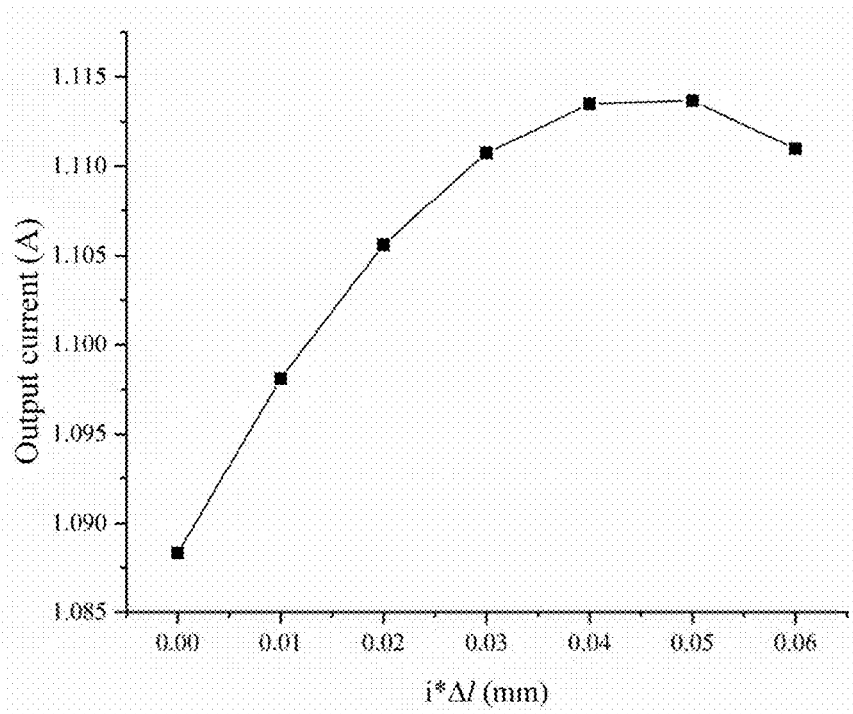
FIG. 4 shows relation diagram of the output current of PN junction thermoelectric couple with the length of semiconductor.
Figure 5:
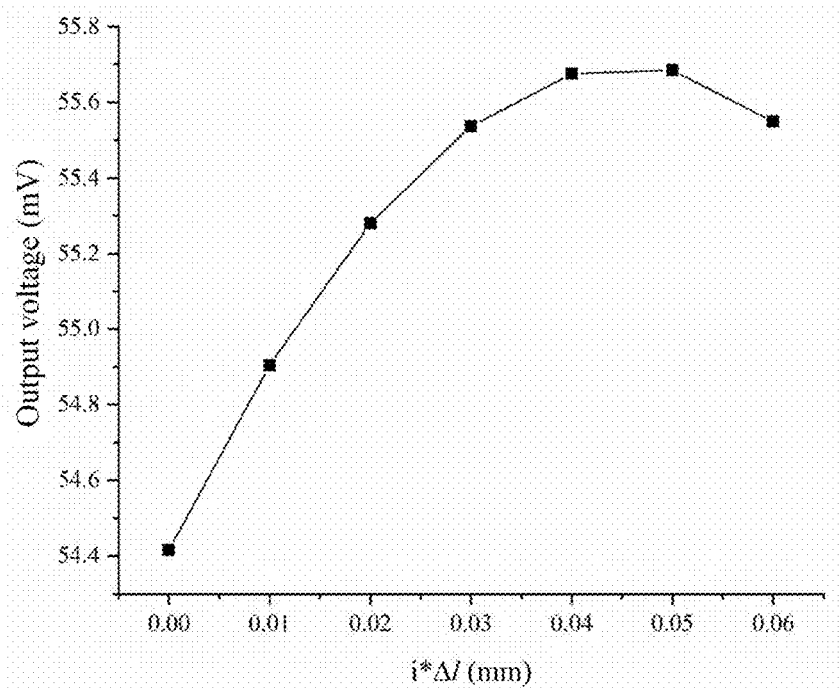
FIG. 5 shows relation diagram of the output voltage of PN junction thermoelectric couple with the length of semiconductor.
Figure 6:
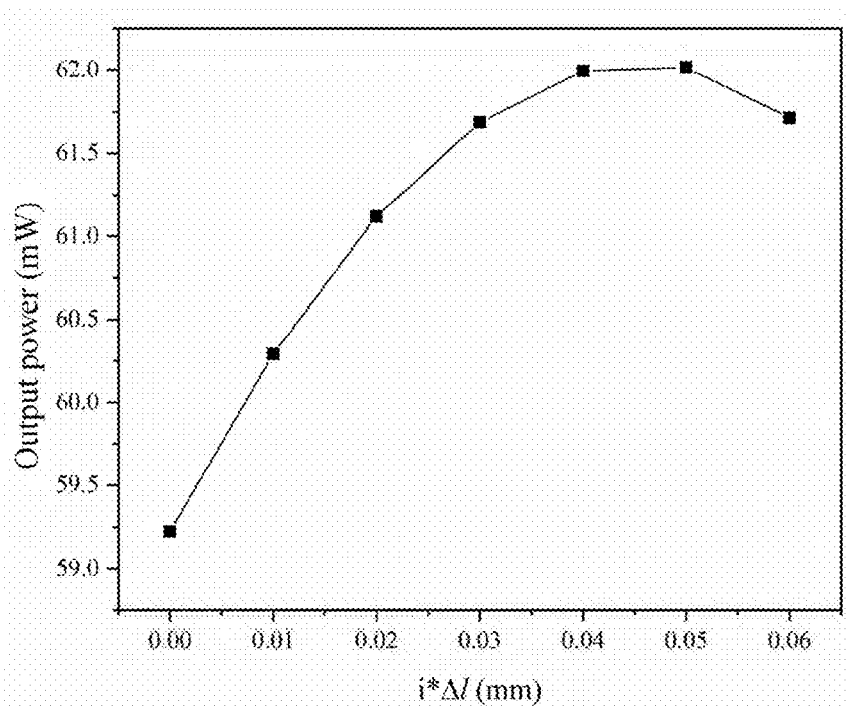
FIG. 6 shows relation diagram of the output power of PN junction thermoelectric couple with the length of semiconductor.

FIG. 4, FIG. 5, and FIG. 6 show the relation diagrams of output current, output voltage, and output power of the PN junction thermoelectric couple with the length of the semiconductor, respectively. It can be observed that when i=5, the condition of $P_5 \geq P_6$ is satisfied, and the loop is ended. At this time, the output power of PN junction thermoelectric couple reaches the maximum value, that is, the finally determined length of the p-type semiconductor is $L_p = 2.2$ mm, and the length of the n-type semiconductor is $L_n = 1.2$ mm. Compared with the traditional PN junction thermoelectric couple structure (i=0), the output current and output voltage of the optimized PN junction are increased by 2.33%, and the output power of the optimized PN junction is increased by 4.71%, under the same amount of used thermoelectric materials.

The specific embodiment is described above in detail according to the technical schemes of the present invention. According to the technical schemes of the present invention, the person skilled in this art can propose a variety of mutually replaceable structure modes and implementation modes, without departing from the essence of the present invention. Therefore, the specific embodiment described above, and the drawings are only exemplary illustration of the technical solutions of the present invention, and should not be regarded as the whole of the present invention or as limitation to the technical schemes of the invention.

The invention claimed is:

1. A method for determining the parameters of an asymmetric PN junction thermoelectric couple structure, comprising the following steps:
    calculating an integral mean value of electrical resistivity of a p-type semiconductor $\overline{\rho_p}$ and an integral mean value of electrical resistivity of a n-type semiconductor $\overline{\rho_n}$;
    determining a length relationship between the p-type semiconductor and the n-type semiconductor;
    establishing differential equations of PN junction thermoelectric couple structure;
    setting boundary conditions to calculate the Peltier heat of the p-type semiconductor and the n-type semiconductor;
    setting current boundary conditions to connect load resistance with copper electrodes;
    setting temperature boundary conditions to load the temperature, and calculating an output voltage at both ends of the load resistance to get an output power of the PN junction thermoelectric couple.

2. The method for determining the parameters of the asymmetric PN junction thermoelectric couple structure according to claim 1, further comprising the step:

if $\overline{\rho_p} > \overline{\rho_n}$, setting the length of the p-type semiconductor $L_p$ as $L+i \times \Delta l$ and setting the length of the n-type semiconductor $L_n$ as $L-i \times \Delta l$;

if $\overline{\rho_p} < \overline{\rho_n}$, setting the length of the p-type semiconductor $L_p$ as $L-i \times \Delta l$ and setting the length of the n-type semiconductor $L_n$ as $L+i \times \Delta l$; and if $\overline{\rho_p} = \overline{\rho_n}$, setting the length of p-type semiconductor as being equal to the length of n-type semiconductor, i.e., $L_p = L_p = L$.

3. The method for determining the parameters of asymmetric PN junction thermoelectric couple structure according to claim 2, wherein the method of determining the length of the p-type semiconductor and the n-type semiconductor when $\overline{\rho_p} > \overline{\rho_n}$ and $\overline{\rho_p} < \overline{\rho_n}$ includes selecting a value of $\Delta l$ to meet the condition of $\Delta l < L/10$, calculating the overall output powers of the PN junction thermoelectric couple $P_0$ and $P_1$ when $i=0, 1$;

determining whether $P_0 < P_1$, and if so, $i=i+1$, returning to recalculate the overall output power of PN junction thermoelectric couple $P_i$, and determining whether $P_i < P_{i+1}$ again, ending the loop until $P_i \geq P_{i+1}$.

4. The method for determining the parameters of the asymmetric PN junction thermoelectric couple structure according to claim 1, wherein the boundary conditions for calculating Peltier heat are as follows:

wherein a bottom contact surface of the p-type semiconductor is in contact with a first bottom copper electrode, and a bottom contact surface of the n-type semiconductor is in contact with a second bottom copper electrode, the temperature of the first and second bottom copper electrodes equals the temperature of the p-type semiconductor and the n-type semiconductor, that is $T_{co}|_{z=H_1+H_2} = T_{P,N}|_{z=H_1+H_2}$;

the heat conduction of the first and second bottom copper electrodes equals the heat conduction of the p-type semiconductor and the n-type semiconductor plus the Peltier heat of the p-type semiconductor and n-type semiconductor, that is, $$-\lambda_{co} \frac{\partial T_{co}}{\partial Z}|_{z=H_1+H_2} = -\lambda_{P,N} \frac{\partial T_{P,N}}{\partial Z}|_{z=H_1+H_2} + \alpha_{P,N} T \overline{J_z}|_{z=H_1+H_2},$$

where $z=H_1+H_2$ represents the coordinate axis positions of the bottom contact surface of the p-type semiconductor and the bottom contact surface of the n-type semiconductor;

on a top contact surfaces of the p-type semiconductor and a top contact surface of the n-type semiconductor, both in contact with a top copper electrode, the temperature of the top copper electrode equals the temperature of the p-type semiconductor and the n-type semiconductor, that is $T_{co}|_{z=H_1+H_2+H_3} = T_{P,N}|_{z=H_1+H_2+H_3}$;

the heat conduction of the top copper electrode equals the heat conduction of the p-type semiconductor and the n-type semiconductor plus the Peltier heat of the p-type semiconductor and n-type semiconductor, that is, $$-\lambda_{P,N} \frac{\partial T_{P,N}}{\partial Z}|_{z=H_1+H_2+H_3} + \alpha_{P,N} T \overline{J_z}|_{z=H_1+H_2+H_3} =$$

-continued $$-\lambda_{co} \frac{\partial T_{co}}{\partial Z}|_{z=H_1+H_2+H_3},$$

where $z=H_1+H_2+H_3$ represents the coordinate axis positions of the top contact surface of the p-type semiconductor and the top contact surface of the n-type semiconductors.

5. The method for determining the parameters of the asymmetric PN junction thermoelectric couple structure according to claim 1, wherein the current boundary conditions are:

on a left end surface of the first bottom copper electrode and a left end surface of a resistance, both surfaces are set to be grounded, that is, the voltage is zero;

on a right end surface of the second bottom copper electrode and a right end surface of the resistance, both surfaces are set to be connected electrically, that is, the voltages are equal.

6. The method for determining the parameters of the asymmetric PN junction thermoelectric couple structure according to claim 1, wherein the temperature boundary conditions are:

the contact surfaces of the PN junction thermoelectric couple with the environment are set as an adiabatic boundary;

a bottom surface of a bottom ceramic plate is set as high temperature boundary, and a top surface of a top ceramic plate is set as low temperature boundary.

7. The method for determining the parameters of the asymmetric PN junction thermoelectric couple structure according to claim 1, wherein the asymmetric PN junction thermoelectric couple structure, comprises ceramic plates in opposite arrangement, the copper electrodes, and the p-type semiconductor and the n-type semiconductor with the same height, wherein the top and bottom contact surfaces of the p-type semiconductor and the n-type semiconductor are connected in series by copper electrodes, and are sandwiched between the top and bottom ceramic plates, wherein the sum of length of the p-type semiconductor $L_p$ and the length of n-type semiconductor $L_n$ is $2L$, and $L$ is the initial length of p-type semiconductor and n-type semiconductor.

8. The method for determining the parameters of the asymmetric PN junction thermoelectric couple structure according to claim 7, wherein the length of the p-type semiconductor $L_p$ is $L \pm i \times \Delta l$, and the length of the n-type semiconductor $L_n$ is $L \mp i \times \Delta l$, wherein i is the number of iterations to be determined, and $\Delta l$ is the length change value of the p-type semiconductor and the n-type semiconductor in each iteration calculation.

9. The method for determining the parameters of the asymmetric PN junction thermoelectric couple structure according to claim 8, wherein the total length of copper electrodes in contact with the top contact surfaces of the p-type semiconductor and the n-type semiconductor is $2L+L_s$, where $L_s$ is the distance between the p-type semiconductor and the n-type semiconductor.

10. The method for determining the parameters of the asymmetric PN junction thermoelectric couple structure according to claim 9, the length of the copper electrode in contact with the bottom end of the p-type semiconductor is $L_p+L_s/2$, and the length of the copper electrode in contact with the bottom end of the n-type semiconductor is $L_n+L_s/2$.

11. An asymmetric PN junction thermoelectric couple structure comprising top and bottom ceramic plates in opposite arrangement, copper electrodes, and a p-type semiconductor and an n-type semiconductor with the same height,
  wherein top and bottom contact surfaces of the p-type semiconductor and the n-type semiconductor are connected in series by the copper electrodes, and are sandwiched between the top and bottom ceramic plates,
  wherein the sum of length of the p-type semiconductor $L_p$ and the length of n-type semiconductor $L_n$ is 2L,
  and L is the initial length of p-type semiconductor and n-type semiconductor.

12. The asymmetric PN junction thermoelectric couple structure according to claim 11, wherein the length of the p-type semiconductor $L_p$ is $L \pm i \times \Delta l$, and the length of the n-type semiconductor $L_n$ is $L \mp i \times \Delta l$,
  wherein i is the number of iterations to be determined, and $\Delta l$ is the length change value of the p-type semiconductor and the n-type semiconductor in each iteration calculation.

13. The asymmetric PN junction thermoelectric couple structure according to claim 12, wherein the total length of copper electrodes in contact with the top contact surfaces of the p-type semiconductor and the n-type semiconductor is $2L+L_s$, wherein $L_s$ is the distance between the p-type semiconductor and the n-type semiconductor.

14. The asymmetric PN junction thermoelectric couple structure according to claim 13, wherein the length of the copper electrode in contact with the bottom end of the p-type semiconductor is $L_p+L_s/2$, and the length of the copper electrode in contact with the bottom end of the n-type semiconductor is $L_n+L_s/2$.

15. The asymmetric PN junction thermoelectric couple structure according to claim 11, wherein the method for determining the parameters of the asymmetric PN junction thermoelectric couple structure comprises the following steps:
  calculating an integral mean value of electrical resistivity of a p-type semiconductor $\overline{\rho_p}$ and an integral mean value of electrical resistivity of a n-type semiconductor $\overline{\rho_n}$;
  determining a length relationship between the p-type semiconductor and the n-type semiconductor;
  establishing differential equations of PN junction thermoelectric couple structure;
  setting boundary conditions to calculate the Peltier heat of the p-type semiconductor and the n-type semiconductor;
  setting current boundary conditions to connect load resistance with copper electrodes;
  setting temperature boundary conditions to load the temperature, and
  calculating an output voltage at both ends of the load resistance to get an output power of the PN junction thermoelectric couple.

* * * * *